US010889727B1

(12) United States Patent
Hawig

(10) Patent No.: US 10,889,727 B1
(45) Date of Patent: Jan. 12, 2021

(54) ELECTRICAL CABLE WITH IMPROVED INSTALLATION AND DURABILITY PERFORMANCE

(71) Applicant: Southwire Company, LLC, Carrollton, GA (US)

(72) Inventor: Yuhsin Hawig, Carrollton, GA (US)

(73) Assignee: Southwire Company, LLC, Carrollton, GA (US)

( * ) Notice: Subject to any disclaimer, the term of this patent is extended or adjusted under 35 U.S.C. 154(b) by 0 days.

(21) Appl. No.: 16/441,210

(22) Filed: Jun. 14, 2019

Related U.S. Application Data

(60) Provisional application No. 62/685,144, filed on Jun. 14, 2018.

(51) Int. Cl.
| | | |
|---|---|---|
| *H01B 7/02* | (2006.01) | |
| *C09D 7/61* | (2018.01) | |
| *C09D 5/00* | (2006.01) | |
| *C09D 123/06* | (2006.01) | |
| *C09D 177/00* | (2006.01) | |
| *H01B 13/14* | (2006.01) | |
| *C09D 7/63* | (2018.01) | |
| *H01B 3/30* | (2006.01) | |

(Continued)

(52) U.S. Cl.
CPC ............... *C09D 7/61* (2018.01); *C09D 5/00* (2013.01); *C09D 7/63* (2018.01); *C09D 7/65* (2018.01); *C09D 123/06* (2013.01); *C09D 177/00* (2013.01); *H01B 3/305* (2013.01); *H01B 3/465* (2013.01); *H01B 13/14* (2013.01)

(58) Field of Classification Search
CPC ........ H01B 3/305; H01B 3/465; H01B 13/14; C09D 7/61; C09D 7/65; C09D 7/63; C09D 5/00; C09D 123/06; C09D 177/00
USPC ............. 174/110 R–110 PM, 120 R, 120 SR, 174/121 R, 121 SR
See application file for complete search history.

(56) References Cited

U.S. PATENT DOCUMENTS

| 3,248,251 A | 4/1966 | Allen |
| 3,464,854 A | 9/1969 | Bolger |
| 3,844,729 A | 10/1974 | Sedlatschek et al. |

(Continued)

FOREIGN PATENT DOCUMENTS

| BR | PI0802480-4 A2 | 7/2008 |
| CA | 2380793 A1 | 10/2002 |

(Continued)

OTHER PUBLICATIONS

Xiu, Yonghau et al. *UV and Thermally Stable Superhydrophobic Coatings From Sol-Gel Processing*, Journal of Colloid and Interface Science, vol. 326, No. 2, (2008), pp. 465-470. DOI:10.1016/J.JCIS.2008.06.042.

(Continued)

*Primary Examiner* — William H. Mayo, III
(74) *Attorney, Agent, or Firm* — Alston & Bird LLP

(57) ABSTRACT

An electrical cable having a conductor having a protecting sheath and/or jacket comprising a base polymer (such as a thermoplastic or thermoset) having an abrasion reducing agent, a lubricant, a hydrophobic agent, and/or a UV protecting agent mixed therein. The resulting cable jacket and/or cable sheath defines an outer surface having abrasion reduction properties, lubricating properties, hydrophobic properties, and/or UV protecting properties.

22 Claims, 1 Drawing Sheet

(51) Int. Cl.
*H01B 3/46* (2006.01)
*C09D 7/65* (2018.01)

(56) References Cited

U.S. PATENT DOCUMENTS

| | | |
|---|---|---|
| 4,248,824 A | 2/1981 | Hattop |
| 4,849,305 A | 7/1989 | Yanagisawa |
| 5,732,322 A | 3/1998 | Nakamaru et al. |
| 5,900,318 A | 5/1999 | Yanagisawa |
| 6,319,604 B1 | 11/2001 | Xu |
| 7,247,266 B2 | 7/2007 | Bolcar |
| 7,411,129 B2 | 8/2008 | Kummer et al. |
| 7,638,709 B2 | 12/2009 | Kenny et al. |
| 8,034,865 B2 | 10/2011 | Hamel et al. |
| 8,227,534 B2 | 7/2012 | Chasey |
| 8,322,754 B2 | 12/2012 | Carcagno et al. |
| 8,658,576 B1 | 2/2014 | Bigbee, Jr. et al. |
| 8,883,917 B1 | 11/2014 | Davies et al. |
| 9,012,781 B2 | 4/2015 | Daniel et al. |
| 9,067,821 B2 | 6/2015 | Bleecher et al. |
| 9,096,786 B2 | 8/2015 | Sikka et al. |
| 9,328,245 B2 | 5/2016 | Siripurapu et al. |
| 9,352,371 B1 | 5/2016 | Bigbee et al. |
| 9,493,615 B2 | 11/2016 | Backer et al. |
| 9,587,201 B2 | 3/2017 | Tomsheck et al. |
| 9,647,303 B2 | 5/2017 | Jin et al. |
| 9,728,299 B2 | 8/2017 | Cade et al. |
| 2003/0017124 A1 | 1/2003 | Agostini et al. |
| 2003/0064232 A1 | 4/2003 | Allen et al. |
| 2003/0159764 A1 | 8/2003 | Goto |
| 2003/0162033 A1 | 8/2003 | Johnson et al. |
| 2004/0029748 A1 | 2/2004 | Levy |
| 2004/0175407 A1 | 9/2004 | McDaniel |
| 2004/0259836 A1 | 12/2004 | Twydell |
| 2006/0029808 A1 | 2/2006 | Zhai et al. |
| 2006/0292345 A1 | 12/2006 | Dave et al. |
| 2007/0065067 A1 | 3/2007 | Gartner et al. |
| 2008/0129044 A1 | 6/2008 | Carcagno et al. |
| 2008/0159671 A1 | 7/2008 | Leonardelli |
| 2008/0240479 A1 | 10/2008 | Linford et al. |
| 2008/0286556 A1 | 11/2008 | D'urso et al. |
| 2009/0076430 A1 | 3/2009 | Simpson et al. |
| 2009/0275685 A1 | 11/2009 | Hamel et al. |
| 2009/0311476 A1 | 12/2009 | Stetina et al. |
| 2010/0098956 A1 | 4/2010 | Sepeur et al. |
| 2010/0101828 A1 | 4/2010 | Duarte Pena et al. |
| 2010/0102693 A1 | 4/2010 | Driver et al. |
| 2010/0275815 A1 | 11/2010 | Dave |
| 2010/0307679 A1* | 12/2010 | Yotsumoto ............ C09J 101/286 156/299 |
| 2010/0310774 A1 | 12/2010 | Wu et al. |
| 2010/0314575 A1 | 12/2010 | Gao et al. |
| 2011/0034590 A1 | 2/2011 | Kuhn et al. |
| 2011/0110992 A1 | 5/2011 | Garrison et al. |
| 2011/0149528 A1 | 6/2011 | Nelson |
| 2012/0097194 A1* | 4/2012 | McDaniel ............... C09D 5/14 134/26 |
| 2012/0172493 A1 | 7/2012 | Dettloff et al. |
| 2013/0153261 A1 | 6/2013 | Bremser et al. |
| 2013/0264090 A1 | 10/2013 | Cade et al. |
| 2013/0264093 A1 | 10/2013 | Fontana et al. |
| 2013/0344236 A1* | 12/2013 | Facinelli ............... H01B 3/305 427/118 |
| 2014/0041925 A1 | 2/2014 | Davis et al. |
| 2014/0308455 A1 | 10/2014 | Bordet et al. |
| 2015/0104641 A1 | 4/2015 | Mhetar et al. |
| 2015/0194240 A1 | 7/2015 | Ranganathan et al. |
| 2015/0315401 A1* | 11/2015 | Lee ........................ C08L 71/02 385/100 |
| 2015/0344748 A1 | 12/2015 | Wohl et al. |
| 2016/0060476 A1* | 3/2016 | Chen ..................... H01B 3/301 174/110 SR |
| 2016/0130520 A1 | 5/2016 | Kong et al. |
| 2017/0145580 A1 | 5/2017 | Dolan et al. |

FOREIGN PATENT DOCUMENTS

| | | |
|---|---|---|
| CA | 2471318 A1 | 12/2004 |
| CA | 2862012 A1 | 12/2013 |
| CN | 1394240 A | 1/2003 |
| CN | 1450139 A | 10/2003 |
| CN | 1509386 A | 6/2004 |
| CN | 1562623 A | 1/2005 |
| CN | 1826221 A | 8/2006 |
| CN | 101585999 A | 11/2009 |
| CN | 101691473 A | 4/2010 |
| CN | 101838576 A | 9/2010 |
| CN | 102676048 A | 9/2012 |
| CN | 103275357 A | 9/2013 |
| CN | 103275396 A | 9/2013 |
| CN | 103426556 A | 12/2013 |
| CN | 105419180 A | 3/2016 |
| CN | 105602178 A | 5/2016 |
| CN | 105694436 A | 6/2016 |
| CN | 105957592 A | 9/2016 |
| CN | 106893162 A | 6/2017 |
| DE | 102005059614 A1 | 6/2007 |
| EP | 189927 A2 | 8/1986 |
| EP | 537360 A1 | 4/1993 |
| EP | 945253 A2 | 9/1999 |
| EP | 1764522 A2 | 3/2007 |
| EP | 2565243 A1 | 3/2013 |
| EP | 2842970 A1 | 3/2015 |
| FR | 2971617 A1 | 8/2012 |
| JP | S6273422 A | 4/1987 |
| JP | H07186322 A | 7/1995 |
| JP | H1110140 A | 1/1999 |
| JP | 2010-280887 A | 12/2010 |
| JP | 2011-148107 A | 8/2011 |
| KR | 10-2005-0079705 A | 8/2005 |
| KR | 20070032248 A | 3/2007 |
| KR | 10-2008-0012242 A | 2/2008 |
| KR | 101086847 B1 | 11/2011 |
| RU | 2483377 C1 | 5/2013 |
| WO | WO-2002/084163 A1 | 10/2002 |
| WO | WO-2006/063468 A1 | 6/2006 |
| WO | WO-2007/045003 A1 | 4/2007 |
| WO | WO-2008/125740 A1 | 10/2008 |
| WO | WO-2011/095208 A1 | 8/2011 |
| WO | WO-2013/161402 A1 | 10/2013 |

OTHER PUBLICATIONS

*Epoxy Novolac Resins: High-Temperature, High-Performance Epoxy Resins*, Dow Plastics, Oct. 1998, (27 pages). [Retrieved from the Internet Aug. 12, 2019] <https://docplayer.net/32262570-Dow-epoxy-novolac-resins-high-temperature-high-performance-epoxy-resins.html>.

*Oriel Product Training: Solar Simulation*, Newport, (32 pages). [Retrieved from the Internet Aug. 12, 2019] <https://pdfs.semanticscholar.org/9dca/d5adc1e65f9f3099d4e5e74a2e6c9d76069a.pdf?_ga=2.225117725.640760144.1565638010-2125987715.1564772906>.

\* cited by examiner

ELECTRICAL CABLE WITH IMPROVED INSTALLATION AND DURABILITY PERFORMANCE

CROSS-REFERENCE TO RELATED APPLICATIONS

This patent application claims priority from U.S. Provisional Patent Application Ser. No. 62/685,144, filed Jun. 14, 2018, which is incorporated herein by reference in its entirety.

BACKGROUND

Electrical cables used for installation within buildings, in underground installations, and/or in exposed installation configurations typically include a cable sheath surrounding a conductor. The cable sheath provides electrical insulation properties, and may further provide environmental protections against damage to the cable, including abrasion resistance, moisture resistance, heat resistance, oil resistance, and gasoline resistance, as well as resistance against incidental mechanical damage that may result from unintended "digins" from shovels or other digging equipment hitting underground cables or nail sets when fasteners are driven into cables embedded within structure walls.

A cable sheath encompasses the outermost protective layer (e.g., a jacket layer) and/or an inner layer (e.g., an insulating layer) surrounding the conductor, and may include one or more material types (e.g., a plurality of polymeric materials) and/or one or more material layers (whether including the same or different layer materials). The conductor may typically be, for example, a single metal wire, multiple small wires twisted together to make a "stranded" cable, or multiple insulated wires or other type electrical conductors acting together to serve a particular function (e.g., three-phase connection). For those cables including a plurality of individually sheathed conductors, the combination of these conductors may be surrounded by a separate, loose cable sheath loosely surrounding the multiple conductors (e.g., such that the loose sheath is not mechanically bonded to any one of the conductors and/or their respective cable sheaths).

Various additives have been provided in cable sheath formulations to improve installation performance and/or to increase cable durability when exposed to various environmental conditions. For example, certain pulling lubricants have been added to cable sheaths to decrease the amount of pull force required during installation of cables within building walls, as described in U.S. Pat. No. 8,382,518, the contents of which are incorporated herein by reference in its entirety.

U.S. patent application Ser. No. 14/745,384, the contents of which have been incorporated herein by reference in its entirety, addresses cable durability concerns for bare, non-insulated cable installations (e.g., bare overhead conductor applications). As discussed therein, bare conductors (e.g., for overhead conductor installations) may be dipped, sprayed, brushed, or otherwise passed through a bath of coating material (e.g., liquid coating material) comprising one or more additives, and the resulting coating may be cured directly onto the surface of the bare conductors to improve the durability, water repellency, and performance of the of the cables, for example, for transmission and distribution applications.

However, certain additives may have negative effects on the structural integrity, durability or weatherability of an underlying polymer of extruded cable sheaths that may be used for underground transmission and distribution applications and/or for above-ground applications in which sheathed cables are pulled through conduits or other installation paths, and accordingly a need exists for new additive configurations providing desirable protective properties for extruded polymeric cable sheaths of electrical cables.

BRIEF SUMMARY

Polymer additives, such as molybdenum disulfide, fumed silica (silicon dioxide), zinc oxide, and/or carbon black may be added, in optimum weight percentage or quantity, during the manufacturing process of a cable sheath to provide desirable characteristics of the finished cable. The additives may be provided in a powder form to be mixed with the underlying polymer of the cable sheath during an extrusion process. For example, the additives may be mixed with the underlying polymer during the initial compounding of the polymeric material to form pellets and/or the additives may be mixed with the polymer material before and/or during introduction of the mixture into the extrusion process for the sheath while the polymer is in a molten state.

The additives may be added as solid particles (e.g., in powder form) that are then suspended and/or dispersed within the extruded polymer matrix while the polymer matrix cools and hardens. Due at least in part to the viscosity of the underlying polymer of the polymer matrix, the powder additives may remain suspended and/or dispersed within the polymer matrix with little diffusion, migration, and/or settling. Other additives may be provided in liquid form, such as silicone oil, which may be mixed with the polymer during an extrusion process. In certain embodiments, certain of these liquid additives may migrate or bloom to the surface of the sheath, such that the pulling lubricant is available to reduce the coefficient of friction of the outermost surface of the cable, which in turn reduces the required installation pulling force of the cable when installed through cable passageways. In other embodiments, certain of these liquid additives may remain suspended and/or dispersed within the polymer matrix with little diffusion, migration, and/or settling. At least a portion of these liquid additives may be available at the outermost surface of the cable based at least in part to the at least substantially uniform distribution of the liquid additives within the polymer matrix of the cable sheath.

In certain embodiments, the additives may be provided within a single layer of a multi-layer sheath (e.g., the outermost layer of the sheath), while other layers of the multi-layer sheath may not include one or more additives.

Certain embodiments are directed to a polymeric composition, which may be utilized to form a cable jacket and/or cable sheath (or an individual layer thereof). The polymeric composition may comprise a base polymer (which may be a thermoplastic, such as polyethylene, polyvinyl chloride, a polyamide such as nylon, and/or the like; or a thermoset, such as crosslinked polyethylene); an abrasion reducing agent comprising molybdenum; and at least one of: a hydrophobic silica; an ultraviolet protecting agent; or a lubricant. In certain embodiments, the abrasion reducing agent is provided in an amount of between about 0.1% to about 15% by weight of the polymeric composition (such as between about 0.1% to 10%; such as between 0.1% to 7%; and/or the like).

In certain embodiments, the polymeric composition comprises the hydrophobic silica (e.g., fumed silica or pyrogenic silica), and wherein the hydrophobic silica is provided in an amount of between about 0.1% to about 15% by weight of the polymeric composition. The polymeric composition may further comprise an ultraviolet protecting agent and/or a lubricant.

In certain embodiments, the polymeric composition comprises the ultraviolet protecting agent, and wherein the ultraviolet protecting agent is provided in an amount of between about 0.1% to about 15% by weight of the polymeric composition (e.g., between about 0.1% to about 10%; between bout 0.1% to 7%; and/or the like). The ultraviolet protecting agent may be one of zinc oxide, titanium dioxide, or carbon black. The polymeric composition may additionally comprise one or more of a hydrophobic agent and/or a lubricant. In certain embodiments, the polymeric composition comprises the lubricant, and wherein the lubricant is provided in an amount of between about 1% to about 15% by weight of the polymeric composition. For example, the polymeric composition is provided in an amount of between about 1% and about 10%, such as between about 1% and about 8%, or between about 1% and about 6%. The lubricant may comprise silicone oil or erucamide. The polymeric composition may additionally comprise at least one of: a hydrophobic agent or an ultraviolet protecting agent. In certain embodiments, the polymeric composition comprises the hydrophobic silica, the ultraviolet protecting agent, and the lubricant. The lubricant may be one of silicone oil or erucamide. Moreover, the abrasion reducing agent may be provided in an amount between about 0.1% and 15% by weight of the polymeric composition; the hydrophobic silica may be provided in an amount between about 0.1% and 15% by weight of the polymeric composition; the ultraviolet protecting agent may be provided in an amount between about 0.1% and 15% by weight of the polymeric composition; and the lubricant may be provided in an amount between about 1% and 15% by weight of the polymeric composition.

Certain embodiments are directed to an electrical cable comprising: at least one conductor capable of carrying an electrical current through the electrical cable; and a sheath for protecting the conductor, wherein the sheath comprises: a polymeric composition electrically insulating the conductor, wherein the polymeric composition comprises: a thermoplastic base polymer; and an abrasion reducing agent comprising molybdenum disulfide.

In various embodiments, the base polymer comprises a polyethylene. Moreover, the base polymer may comprise a polyamide. In certain embodiments, the base polymer comprises a nylon. In various embodiments, the abrasion reducing agent is provided in an amount of between about 0.1% to about 15% by weight of the polymeric composition. In certain embodiments, the abrasion reducing agent is provided in an amount of between about 0.1% to about 10% by weight of the polymeric composition. According to various embodiments, the polymeric composition comprises at least one of: a hydrophobic silica; an ultraviolet protecting agent; or a lubricant. In certain embodiments, the polymeric composition comprises a lubricant, and wherein the lubricant comprises silicone oil. Moreover, the polymeric composition may comprise a lubricant, and wherein the lubricant comprises erucamide. In certain embodiments, the sheath comprises a first layer and a second layer, and wherein the first layer defines an outer surface of the electrical cable, and wherein the first layer comprises the polymeric composition. In certain embodiments, the polymeric composition is a first polymeric composition, and wherein the second sheath layer comprises a second polymer composition different from the first polymer composition.

Various embodiments are directed to an electrical cable comprising: at least one conductor capable of carrying an electrical current through the electrical cable; and a sheath for protecting the conductor, wherein the sheath comprises: a polymeric composition electrically insulating the conductor, wherein the polymeric composition comprises: a thermoset base polymer; and an abrasion reducing agent comprising molybdenum disulfide.

In certain embodiments, the base polymer comprises a cross-linked polyethylene. In various embodiments, the abrasion reducing agent is provided in an amount of between about 0.1% to about 15% by weight of the polymeric composition. In certain embodiments, the abrasion reducing agent is provided in an amount of between about 0.1% to about 10% by weight of the polymeric composition. Moreover, the polymeric composition may comprise at least one of: a hydrophobic silica; an ultraviolet protecting agent; or a lubricant. In certain embodiments, the polymeric composition comprises a lubricant, and wherein the lubricant comprises silicone oil. In certain embodiments, the polymeric composition comprises a lubricant, and wherein the lubricant comprises erucamide. Moreover, the sheath may comprise a first layer and a second layer, and wherein the first layer defines an outer surface of the electrical cable, and wherein the first layer comprises the polymeric composition. In certain embodiments, the polymeric composition is a first polymeric composition, and wherein the second sheath layer comprises a second polymer composition different from the first polymer composition. In various embodiments, the second polymer composition comprises a thermoplastic base polymer.

Certain embodiments are directed to an electrical cable comprising: at least one conductor capable of carrying an electrical current through the electrical cable; and a sheath for protecting the conductor, wherein the sheath comprises: a polymeric composition electrically insulating the conductor, wherein the polymeric composition comprises: a base polymer; an abrasion reducing agent comprising molybdenum disulfide; and a hydrophobic agent comprising a hydrophobic silica.

In certain embodiments, the abrasion reducing agent is provided in an amount of between about 0.1% to about 15% by weight of the polymeric composition. In various embodiments, the abrasion reducing agent is provided in an amount of between about 0.1% to about 10% by weight of the polymeric composition. In certain embodiments, the hydrophobic agent is provided in an amount of between about 0.1% to about 15% by weight of the polymeric composition. In certain embodiments, the hydrophobic silica is one of a fumed silica or a pyrogenic silica. Moreover, the polymeric composition may comprise at least one of: an ultraviolet protecting agent or a lubricant. In certain embodiments, the polymeric composition comprises a lubricant, and wherein the lubricant comprises silicone oil. In certain embodiments, the polymeric composition comprises a lubricant, and wherein the lubricant comprises erucamide. Moreover, the sheath may comprise a first layer and a second layer, and wherein the first layer defines an outer surface of the electrical cable, and wherein the first layer comprises the polymeric composition. In certain embodiments, the polymeric composition is a first polymeric composition, and wherein the second sheath layer comprises a second polymer composition different from the first polymer composition.

Certain embodiments are directed to an electrical cable comprising: at least one conductor capable of carrying an electrical current through the electrical cable; and a sheath for protecting the conductor, wherein the sheath comprises:

a polymeric composition electrically insulating the conductor, wherein the polymeric composition comprises: a base polymer; an abrasion reducing agent comprising molybdenum disulfide; and an ultraviolet protecting agent. In certain embodiments, the abrasion reducing agent is provided in an amount of between about 0.1% to about 15% by weight of the polymeric composition. In various embodiments, the abrasion reducing agent is provided in an amount of between about 0.1% to about 10% by weight of the polymeric composition. In various embodiments, the ultraviolet protecting agent is provided in an amount of between about 0.1% to about 15% by weight of the polymeric composition. Moreover, the ultraviolet protecting agent may be one of zinc oxide, titanium dioxide, or carbon black. In certain embodiments, the polymeric composition comprises at least one of: a hydrophobic agent or a lubricant. In various embodiments, the polymeric composition comprises a lubricant, and wherein the lubricant comprises silicone oil. In certain embodiments, the polymeric composition comprises a lubricant, and wherein the lubricant comprises erucamide. Moreover, the sheath may comprise a first layer and a second layer, and wherein the first layer defines an outer surface of the electrical cable, and wherein the first layer comprises the polymeric composition. In certain embodiments, the polymeric composition is a first polymeric composition, and wherein the second sheath layer comprises a second polymer composition different from the first polymer composition.

Various embodiments are directed to an electrical cable comprising: at least one conductor capable of carrying an electrical current through the electrical cable; and a sheath for protecting the conductor, wherein the sheath comprises: a polymeric composition electrically insulating the conductor, wherein the polymeric composition comprises: a base polymer; an abrasion reducing agent comprising molybdenum disulfide; and a lubricant.

In various embodiments, the abrasion reducing agent is provided in an amount of between about 0.1% to about 15% by weight of the polymeric composition. Moreover, the abrasion reducing agent may be provided in an amount of between about 0.1% to about 10% by weight of the polymeric composition. In certain embodiments, the lubricant is provided in an amount of between about 1% to about 15% by weight of the polymeric composition. In various embodiments, the polymeric composition comprises at least one of: a hydrophobic agent or an ultraviolet protecting agent. In certain embodiments, the lubricant comprises silicone oil. In various embodiments, the lubricant comprises erucamide. In certain embodiments, the sheath comprises a first layer and a second layer, and wherein the first layer defines an outer surface of the electrical cable, and wherein the first layer comprises the polymeric composition. Moreover, the polymeric composition is a first polymeric composition, and wherein the second sheath layer comprises a second polymer composition different from the first polymer composition.

Certain embodiments are directed to a method of manufacturing an electrical cable, the method comprising: advancing at least one conductor wire through an extrusion head; supplying a polymeric composition to the extrusion head, wherein the polymeric composition comprises: a base polymer; and an abrasion reducing agent comprising molybdenum disulfide; and extruding the polymeric composition from the extrusion head and around the conductor wire so as to form a cable sheath surrounding the conductor wire.

In certain embodiments, the polymeric composition further comprises at least one of: a hydrophobic silica; an ultraviolet protecting agent; or a lubricant. Moreover, the base polymer comprises a thermoplastic selected from: a polyethylene, a polyamide, or a polyvinyl chloride. In various embodiments, the base polymer comprises a thermoset. In certain embodiments, the base polymer comprises a cross-linked polyethylene. In yet other embodiments, the abrasion reducing agent is provided in an amount of between about 0.1% to about 15% by weight of the polymeric composition. In various embodiments, the method further comprises supplying a second polymeric composition to the extrusion head; extruding the second polymeric composition from the extrusion head and around the conductor wire so as to form a first layer of the cable sheath surrounding the conductor wire; and wherein extruding the polymeric composition from the extrusion head comprises extruding the polymeric composition around an outer surface of the first layer of the cable sheath to form a second layer of the cable sheath. In certain embodiments, the second polymer composition is different from the first polymer composition.

Various embodiments are directed to a method of manufacturing an electrical cable comprising: advancing at least one conductor through an extrusion head; supplying a polymeric composition to the extrusion head, wherein the polymeric composition comprises: a base polymer; and an abrasion reducing agent comprising molybdenum disulfide; and extruding the polymeric composition from the extrusion head and around the conductor, wherein the extruded polymeric composition is initially spaced from the at least one conductor; and pulling the polymeric composition onto the at least one conductor to form a cable jacket around the at least one conductor.

In various embodiments, the polymeric composition further comprises at least one of: a hydrophobic silica; an ultraviolet protecting agent; or a lubricant. In certain embodiments, the base polymer comprises a thermoplastic selected from: a polyethylene, a polyamide, or a polyvinyl chloride. Moreover, the base polymer may comprise a thermoset. In various embodiments, the base polymer comprises a cross-linked polyethylene. In certain embodiments, the abrasion reducing agent is provided in an amount of between about 0.1% to about 15% by weight of the polymeric composition. In various embodiments, the method further comprises: supplying a second polymeric composition to the extrusion head; extruding the second polymeric composition from the extrusion head and around the conductor so as to form a first layer of the cable jacket surrounding the conductor; and wherein extruding the polymeric composition from the extrusion head comprises extruding the polymeric composition around an outer surface of the first layer of the cable jacket to form a second layer of the cable jacket. In certain embodiments, the second polymer composition is different from the first polymer composition.

BRIEF DESCRIPTION OF THE SEVERAL VIEWS OF THE DRAWINGS

Reference will now be made to the accompanying drawings, which are not necessarily drawn to scale, and wherein.

DETAILED DESCRIPTION

The present disclosure more fully describes various embodiments. It should be understood that some, but not all embodiments are shown and described herein. Indeed, the embodiments may take many different forms, and accordingly this disclosure should not be construed as limited to the embodiments set forth herein. Rather, these embodiments are provided so that this disclosure will satisfy applicable legal requirements. Like numbers refer to like elements throughout.

Insulated electrical cables, such as those shown in FIGS. 1A-2B may be formed by passing a bare conductor (e.g., aluminum, aluminum alloy, copper, copper alloy, steel, steel alloy, polymer composite (e.g., a carbon fiber polymer composite core comprising carbon fibers embedded within a polymer matrix), and/or any other suitable types of conductive materials), comprising a single conductor or multiple conductor strands through an extrusion head, where one or more layers of a cable sheath (which may comprise an insulating layer and an overlying jacket layer) may be extruded around the perimeter of the bare conductor. The resulting cable sheath comprises the outermost protective covering surrounding the conductor, whether of a single type material or multiple layers of the same or different material.

The conductor of certain embodiments may comprise a single conductive material (e.g., a single strand of a particular conductive material or multiple strands of the particular conductive material) or multiple conductive materials. For example, various embodiments may comprise a conductor core of a first material surrounded by multiple strands of a second conductive material. In certain embodiments, the conductor core itself may have one or more layers of a cable sheath extruded around the perimeter thereof, and the conductor core with the overlying cable sheath may be surrounded by the strands of the second conductive material. In other embodiments, the conductor may comprise strands of a first conductive material and strands of a second conductive material that collectively form a bare conductor.

Figures 1A, 1B:
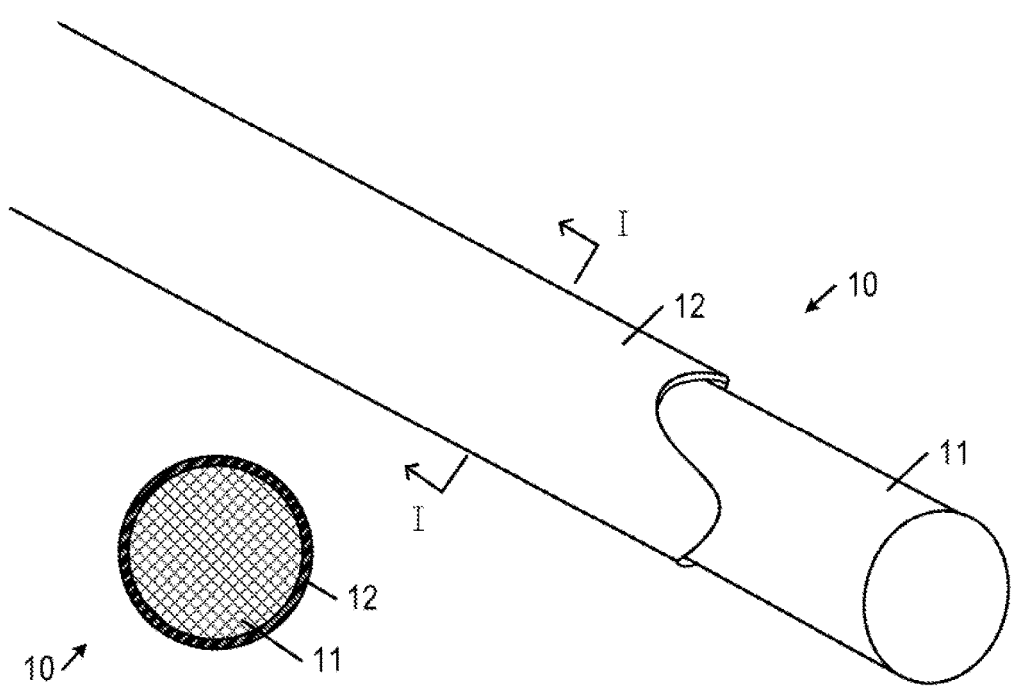
FIG. 1A shows an insulated electrical cable having a single-layer sheath according to certain embodiments.
FIG. 1B is a cross-sectional view of the insulated electrical cable shown in FIG. 1A, taken along lines I-I.

Example cable manufacturing processes, including both insulated and non-insulated cable manufacturing processes, are described in detail in U.S. Pat. No. 8,382,518 and co-pending U.S. patent application Ser. No. 14/620,963, each of which are incorporated herein by reference in their entirety. For insulated cables, each layer of the cable sheath may comprise one or more polymer compositions that are extruded in a molten form around the outer surface of the conductor and allowed to cool and harden to form the cable sheath layer. In certain embodiments, a negative pressure may be formed between the extruded polymer composition and the conductor while the polymer composition is still pliable to pull the sheath layers onto the surface of the conductor. The various layers of the polymeric sheath then cool and harden around the conductor to provide a completed insulated electrical cable. For example, as shown in FIGS. 1A-1B, an insulated electrical cable 10 may have a single layer of insulation 12 surrounding a conductor 11. An inner surface of the single layer of insulation 12 is in contact with the outer surface of the conductor 11, and an outer layer of the single layer of insulation 12 defines the outermost surface of the insulated electrical cable 10.

Figures 2A, 2B:
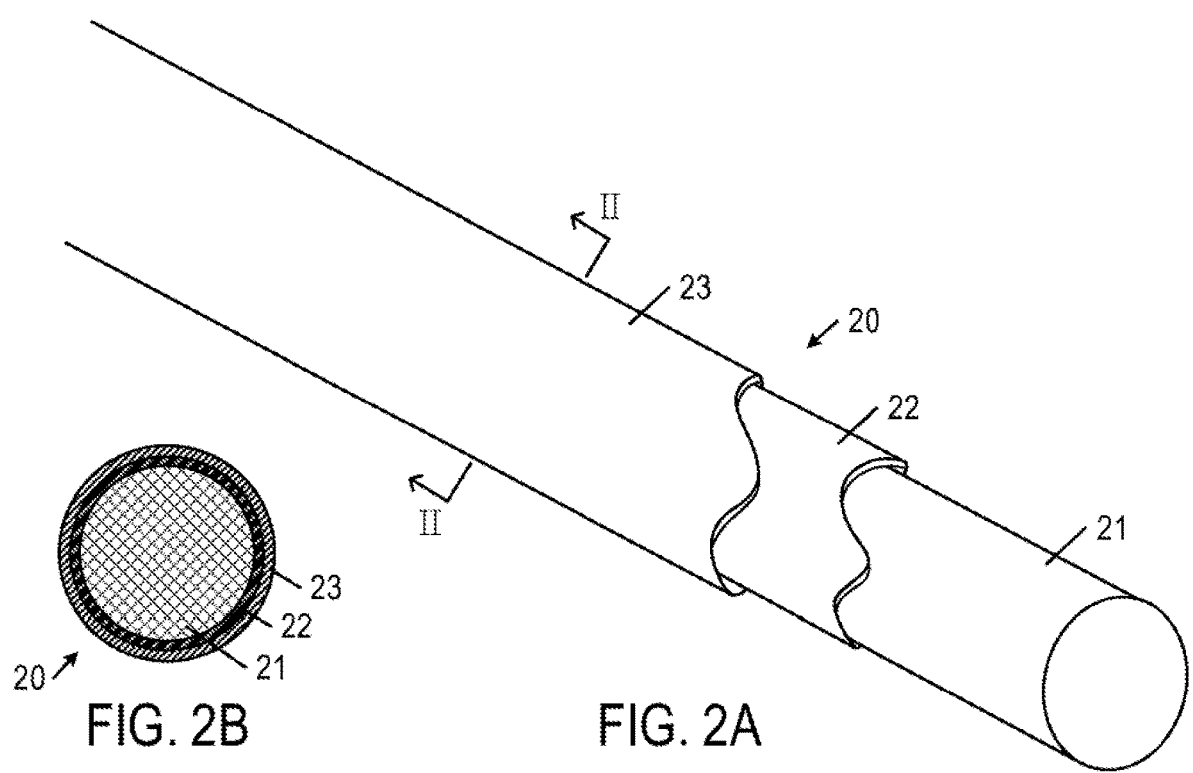
FIG. 2A shows an insulated electrical cable having a multi-layer sheath according to certain embodiments.
FIG. 2B is a cross-sectional view of the insulated electrical cable shown in FIG. 2A, taken along lines II-II.

In embodiments comprising a plurality of cable sheath layers, such as the insulated electrical cable 20 shown in FIGS. 2A-2B, the various layers may be coextruded or tandem extruded to provide an inner layer 22 (e.g., an insulating layer having electrical insulative properties) adjacent the surface of the conductor 21 and an outer layer 23 (e.g., an outer jacket layer providing physical durability to the cable) forming an outermost surface of the cable.

The polymeric cable sheath comprises a polymeric base or binder, such as a thermoplastic or thermoset polymer. For example, suitable polymeric base materials comprise polyethylene (e.g., linear low density polyethylene (LLDPE), medium-density polyethylene (MDPE), high-density polyethylene (HDPE), chlorinated polyethylene (CPE), cross-linked polyethylene (XLPE), and/or the like), polypropylene, polyvinylchloride (PVC), organic polymeric thermosetting and thermoplastic resins and elastomers, polyolefins, copolymers, vinyls, olefin-vinyl copolymers, polyamides, acrylics, polyesters, fluorocarbons, polytetrafluoroethylene (PTFE), polyvinylidene difluoride (PVDF), polyhexafluoropropylene (PHFP), and the like. Multi-layer sheaths may comprise an inner insulating layer comprising a first polymeric base/binder and an outer protecting layer (also referred to as a jacket layer) comprising a second polymeric base/binder (e.g., wherein the second polymeric base/binder is different from the first polymeric base/binder). As just one example, low-voltage cables, such as a THHN cable may comprise a PVC inner layer and a nylon outer layer for the cable sheath. As yet another example, substation control cables may comprise a plurality of separately sheathed conductors surrounded by a loose cable sheath comprising polyethylene insulating layer and a PVC jacketing layer. As yet other examples, medium voltage, high voltage, and/or extra-high voltage cables may comprise any of a variety of insulating layers, including crosslinked polyethylene (XLPE), tree-retardant cross-linked polyethylene (TR-XLPE), flame-retardant cross-linked polyethylene (FR-XLPE), leaded ethylene propylene rubber-insulated (EPR), non-lead EPR, and/or the like. Moreover, high voltage and/or extra-high voltage cables may additionally comprise a semiconductive coating layer (e.g., comprising conductive carbon black) enabling electrical testing in the field. These high voltage and/or extra-high voltage cables may additionally comprise one or more protective layers (e.g., secured onto and/or relative to the outside of the semiconductive layers). In certain embodiments, various cables may comprise one or more shielding or neutral layers, such as uncoated copper round concentric neutrals, coated tinned copper concentric neutrals, flat-strap neutrals, helically applied copper tape, longitudinally applied corrugated cooper tape, braided tape shield, and/or the like. These shielding or neutral layers may be positioned outside of an insulating layer and/or between a plurality of insulating layers. Accordingly, sheathed cables as discussed herein may be utilized for any of a variety of purposes, including buried underground as distribution and/or transmission cables, installed through cable trays, conduit, ducts, or other above-ground or underground cable installation paths as distribution, transmission, signal, or control cables, and/or the like.

The polymeric base/binder providing electrical insulating properties for the cable should be suitably stable at a wide range of temperatures depending upon an intended application for the cable. For example, polymeric compositions forming a cable sheath may have sufficiently high thermal stability or rating in order to withstand elevated temperatures of the conductor (e.g., due to an electrical load or current running through the conductor member). The onset or softening of the polymer base material, also referred to as its glass transition temperature ($T_g$) and/or the melting temperature ($T_m$) of the polymeric base must be great enough to withstand heat dissipated from the internal conductor. Suitable $T_g$ or $T_m$ values for polymeric base materials may be between about 75° C. to about 350° C., such as from about 100° C. to about 300° C., from about 150° C. to about 280° C. and/or from about 200° C. to about 250° C.

The polymeric base material embodies a majority (50% or greater by weight of the polymeric composition) of the polymeric composition forming a respective layer of the cable sheath. For example, the polymeric base material may embody at least about 60% by weight of the polymeric composition forming a single layer of an extruded polymeric layer, at least about 70% by weight of the polymeric composition, at least about 80% by weight of the polymeric composition, or at least about 90% by weight of the polymeric composition.

The polymeric compositions further include one or more additives to increase desirable physical characteristics of the resulting cable sheath. For example, the polymeric composition may be extruded around conductors to form UV-resistant and/or superhydrophobic (characterized by a water droplet contact angle on a surface of the cable sheath greater than or equal to 150°) cable sheaths and/or cable sheaths having heat and chemical resistant properties. The polymeric composition can be resistant to permeation by water, including sea water, and have a sufficient hardness, abrasion resistance and toughness while also a suitable flexibility. Moreover, the polymeric compositions of various embodiments further comprise one or more flame-retardant additives to provide flame retardant properties to the cable. Certain additives that may be usable here are discussed in co-pending U.S. application Ser. No. 14/745,384, which is incorporated herein by reference in its entirety.

For example, the hydrophobicity of the cable sheath may be enhanced by incorporating a hydrophobic silicon dioxide ($SiO_2$ or silica), such as hydrophobic fumed or pyrogenic silica into the polymer composition. The hydrophobic silica may be provided in an amount between about 0.1%-15% by weight of the polymeric composition. As specific examples, hydrophobic silica may be provided in an amount between about 1%-12% by weight of the polymeric composition, or more specifically between about 1%-8% by weight of the polymeric composition.

As used herein, the term "hydrophobic silica" or "hydrophobic silica composition" refers to silica that has been treated with organic surfactants and/or polymers so as to bond hydrophobic functional groups to silica thus yielding a composition having a degree of hydrophobicity that is greater (i.e., more hydrophobic) in relation to silica prior to treatment. For example, silica can be hydrophobized to include any one or more functional polymer groups including, without limitation, alkyl, alkoxy, silyl, alkoxysilyl, siloxy, bonded to the surface of the silica to obtain a hydrophobic fumed or pyrogenic silica. The hydrophobic silica can also be formed from fumed or pyrogenic silica, which is silica produced via flame pyrolysis of, e.g., silicon tetrachloride or quartz sand. Fumed or pyrogenic silica comprises amorphous silica that is fused into branched particles resulting in a powder having low bulk density and high surface area. In example embodiments, the hydrophobic silica can have a BET (Brunauer, Emmett and Teller) surface area from about 80 $m^2/g$ to about 300 $m^2/g$. In other example embodiments, the hydrophobic silica can have a carbon content greater than zero (where a carbon content of zero represents silica that has not been treated with carbon-containing polymers), such as a carbon content of at least about 0.5% by weight, a carbon content of at least about 1.0% by weight, or a carbon content of at least about 1.5% by weight. For example, the hydrophobic silica can have a carbon content from about 0.5% by weight to about 7.0% by weight of the silica.

Some specific examples of polymer functional groups suitable for bonding with silica (and/or fumed or pyrogenic silica) to form a hydrophobic silica for use in polymer compositions as described herein include methyl chlorosilanes, hexamethyldisilazane (HMDS), polydimethylsiloxane (PDMS), octylsilane, hexadecylsilane, methacrylsilane, dimethyldichlorosilane (DDS), and octamethylcyclotetrasiloxane. Selection of one or more specific types of hydrophobic silica, each of which includes specific functional groups, to add to the polymeric compositions controls the amount or degree at which hydrophobicity of the coating compositions can be modified. In other words, the hydrophobicity of the polymeric compositions can be precisely modified or "fine-tuned" based upon the selection of one or more specific types of hydrophobic silica compositions, as well as the amount, to add to the polymeric compositions.

Some non-limiting specific examples of various grades of one or more suitable hydrophobic silica compositions that can be added to the polymeric compositions of the present invention are: hydrophobic silica compositions having HMDS, PDMS, octylsilane, hexadecylsilane, methacrylsilane, DDS or octamethylcyclotetrasiloxane as a functional group and commercially available under the trade names AEROSIL R 104, AEROSIL R 106, AEROSIL R 202, AEROSIL R 208, AEROSIL R 504, AEROSIL R 711, AEROSIL R 805, AEROSIL R 812, AEROSIL R 812S, AEROSIL R 972, AEROSIL R 974, AEROSIL R816 AEROSIL R 7200, AEROSIL R 8200, and AEROSIL R 9200 (Evonik Industries AG, Germany); hydrophobic silica compositions having methyl chlorosilanes or HMDS as a functional group and commercially available under the trade names HDK H13L, HDK H15, HDK H17, HDK H18, HDK H20, HDK H30 and HDK H2000 (Wacker Chemie AG, Germany); and hydrophobic silica compositions having HMDS, DDS or PDMS as a functional group and commercially available under the trade names CAB-O-SIL TS-530, CAB-O-SIL TS-610, CAB-O-SIL TS-622 and CAB-O-SIL TS-720 (Cabot Corporation, Georgia, USA).

The polymeric compositions can further be enhanced by providing a friction reducing and/or abrasion reducing agent such as molybdenum disulfide ($MoS_2$) as an additive mixed into the polymeric composition prior to formation of the cable sheath (e.g., before and/or during the extrusion process). The friction reducing and/or abrasion reducing agent lowers the coefficient of friction of the polymeric composition and/or increases the hardness of the polymeric composition so as to render the polymeric compositions more durable and resistant to wear caused by abrasion on the polymeric surface and to decrease the amount of pull force necessary to install cables through cable installation pathways. For example, in embodiments in which the polymeric compositions are applied to conductor surfaces, the friction reducing and/or abrasion reducing agent added to the coating compositions minimizes damage to the coating during installation of the conductors. The friction reducing and/or abrasion reducing agent can be provided in an amount from about 0.1% to about 15% by weight of the polymeric composition (for example, from about 0.1% to about 10% by weight of the polymeric composition, or from about 2% to about 5% by weight of the polymeric composition). Some non-limiting examples of suitable friction reducing and/or abrasion reducing agents in the form of molybdenum disulfide that can be added to the polymeric compositions of the present invention are a product commercially available under the trade name MCLUBE (McGee Industries) (e.g., MCLUBE MoS2-98 or MCLUBE MoS2-100) and MoS2 products commercially available from Noah Technologies Corporation (Texas, USA).

Certain embodiments may comprise a plurality of friction reducing agents added and/or mixed into the polymeric composition. For example, silicone oil (e.g., low molecular weight silicone oil or high molecular weight silicone oil), erucamide, and/or the like may be added to the polymeric composition in addition to the molybdenum disulfide.

As mentioned, the molybdenum disulfide may increase the surface hardness of the polymeric composition, thereby increasing the abrasion resistance of the cable to improve the cable resistance to bunching and/or catching on conduit corners or other sharp elements within an installation path for the cable. Other friction-reducing additives, such as silicone oil and/or erucamide, may reduce the effects of friction on the surface of the cable sheath by acting as a lubricant that migrates to, or is otherwise made available at the surface of the extruded cable sheath such that the lubricating additive effectively forms a thin lubricating film between the surface of the cable sheath and the surface of any materials forming the installation path for the cable.

In such embodiments, the quantity of each friction reducing agent may be adjusted so as to ensure that the friction reducing agents do not serve to diminish desirable characteristics of the underlying base polymer (e.g., tensile strength, flexibility, elasticity, and/or the like). The silicone oil may be a portion of a Masterbatch additive composition provided and/or mixed into the polymeric composition to provide friction-reducing properties of the finished cable. For example, a siloxane-based Masterbatch (e.g., Siloxane Masterbatch products provided by Dow Corning®) may be mixed with the polymeric composition in an amount between about 1%-15% by weight of the polymeric composition, or more specifically between about 2%-6% by weight of the polymeric composition.

At least one UV protection agent, such as zinc oxide (ZnO), titanium dioxide ($TiO_2$), or carbon black may also be provided and added into the polymeric compositions to provide enhanced UV protection and wear resistance against sunlight and other external environment elements, such that the polymeric composition maintains or substantially maintains its hydrophobic properties even after long periods of exposure to UV radiation. The one or more UV protection agents can be provided in an amount of about 0.1% to about 15% by weight of the polymeric composition, such as from about 0.1% to about 10% by weight of the coating composition, or specifically from about 1% to about 8% by weight of the coating composition. Some non-limiting examples of zinc oxide products that can be provided in the coating compositions are commercially available under the trade names ZANO (Umicore Zinc Chemicals) (e.g., ZANO 20) and Z-COTE (BASF Corporation).

Polymeric compositions can be formed by mixing the components as described herein (polymer base, one or more hydrophobic silica compositions, one or more UV protection agents and/or friction reducing agent) in any suitable manner. The mixture may be supplemented with one or more pigments to provide a finished cable sheath having a desired color. The mixture may then be heated and extruded to the conductor surface, and then cooled to harden the polymeric composition onto the conductor. As discussed herein, the various polymeric compositions may be mixed prior to the extrusion process utilized to form the cable sheath. For example, the polymeric compositions may be mixed and extruded to form pellets, which may then be later melted and extruded to form the cable sheath. These pellets may comprise one or more of the additives, and/or additional additives may be provided when extruding the polymers to form the cable sheath. As just one non-limiting example, pigments may be mixed with pellets comprising the polymeric compositions during the extrusion process to form the cable sheaths, and the remaining portions of the polymeric compositions may be provided within the provided pellets.

Some non-limiting examples of forming cable sheaths comprising polymeric compositions in accordance with the present invention are described in Examples 1-7.

Example 1

A coating composition that may be extruded around an outer surface of a conductor to form a medium-voltage, TR-XLPE underground distribution (UD) cable may be formed including the components listed in Table 1.

TABLE 1

| Component | Amount |
|---|---|
| LLDPE (BASE RESIN) | 86 wt % |
| Dow Corning ® MB25-502 Masterbatch (LOW FRICTION) | 8 wt % |
| McLube MoS2-98 (molybdenum disulfide) | 3 wt % |
| AEROSIL R 8200 (fumed silica) | 2 wt % |
| Zano 20 (zinc oxide) | 1 wt % |
| Total | 100 wt % |

The components may be mixed within an extruder, or prior to extrusion (e.g., as pellets/powders, as melted components, and/or the like). The components are extruded at a temperature of between about 215-250° C. onto an outer surface of a conductor. The resulting coated conductor requires a significantly reduced amount of force to pull the conductor though a building passageway than a similar conductor (e.g., having the same gauge) without the inclusion of the various additives. Moreover, the resulting cable has an improved resistance to UV-based degradation, abrasion and moisture intrusion.

Example 2

A coating composition that may be extruded around an outer surface of a conductor to form a medium-voltage UD cable (e.g., EPR coated) may be formed including the components listed in Table 2.

TABLE 2

| Component | Amount |
|---|---|
| LLDPE (BASE RESIN) | 93 wt % |
| Dow Corning ® MB25-035 Masterbatch (LOW FRICTION) | 3 wt % |
| McLube MoS2-98 (molybdenum disulfide) | 2 wt % |
| AEROSIL R 8200 (fumed silica) | 1 wt % |
| Zano 20 (zinc oxide) | 1 wt % |
| Total | 100 wt % |

The components may be mixed within an extruder, or prior to extrusion (e.g., as pellets/powders, as melted components, and/or the like). The components are extruded at a temperature of between about 215-250° C. onto an outer surface of a conductor. The resulting coated conductor requires a significantly reduced amount of force to pull the conductor though a building passageway than a similar conductor (e.g., having the same gauge) without the inclusion of the various additives. Moreover, the resulting cable has an improved resistance to UV-based degradation, abrasion and moisture intrusion.

Example 3

A coating composition that may be extruded around an outer surface of a conductor to form a medium-voltage, TR-XLPE UD cable may be formed including the components listed in Table 3.

TABLE 3

| Component | Amount |
| --- | --- |
| HDPE (BASE RESIN) | 85 wt % |
| Dow Corning ® MB50-314 Masterbatch (LOW FRICTION) | 4 wt % |
| McLube MoS2-100 (molybdenum disulfide) | 4 wt % |
| AEROSIL R 8125 (fumed silica) | 5 wt % |
| Zano 20 plus (zinc oxide) | 2 wt % |
| Total | 100 wt % |

The components may be mixed within an extruder, or prior to extrusion (e.g., as pellets/powders, as melted components, and/or the like). The components are extruded at a temperature of between about 215-260° C. onto an outer surface of a conductor. The resulting coated conductor requires a significantly reduced amount of force to pull the conductor though a building passageway than a similar conductor (e.g., having the same gauge) without the inclusion of the various additives. Moreover, the resulting cable has an improved resistance to UV-based degradation, abrasion and moisture intrusion.

Example 4

A coating composition that may be extruded around an outer surface of a conductor to form a medium voltage, EPR UD cable may be formed including the components listed in Table 4.

TABLE 4

| Component | Amount |
| --- | --- |
| PP (Polypropylene) (BASE RESIN) | 83 wt % |
| Dow Corning ® MB50-001 Masterbatch (LOW FRICTION) | 6 wt % |
| McLube MoS2-100 (molybdenum disulfide) | 5 wt % |
| AEROSIL R 8125 (fumed silica) | 4 wt % |
| Zano 20 plus (zinc oxide) | 2 wt % |
| Total | 100 wt % |

The components may be mixed within an extruder, or prior to extrusion (e.g., as pellets/powders, as melted components, and/or the like). The components are extruded at a temperature of between about 185-240° C. onto an outer surface of a conductor. The resulting coated conductor requires a significantly reduced amount of force to pull the conductor though a building passageway than a similar conductor (e.g., having the same gauge) without the inclusion of the various additives. Moreover, the resulting cable has an improved resistance to UV-based degradation, abrasion and moisture intrusion.

Example 5

A coating composition that may be extruded around an outer surface of a conductor to form a low-voltage (e.g., THHN) cable may be formed including the components listed in Table 5.

TABLE 5

| Component | Amount |
| --- | --- |
| Nylon 6 or PA6 (polyamide 6) (BASE RESIN) | 70 wt % |
| Dow Corning ® MB50-811 Masterbatch (LOW FRICTION) | 12 wt % |
| McLube MoS2-100 (molybdenum disulfide) | 6 wt % |
| AEROSIL R 9200 (fumed silica) | 8 wt % |
| Zano 20 plus (zinc oxide) | 4 wt % |
| Total | 100 wt % |

The components may be mixed within an extruder, or prior to extrusion (e.g., as pellets/powders, as melted components, and/or the like). The components are extruded at a temperature of between about 240-290° C. onto an outer surface of a conductor. The resulting coated conductor requires a significantly reduced amount of force to pull the conductor though a building passageway than a similar conductor (e.g., having the same gauge) without the inclusion of the various additives. Moreover, the resulting cable has an improved resistance to UV-based degradation, abrasion and moisture intrusion.

Example 6

A coating composition that may be extruded around an outer surface of a conductor to form a medium-voltage cable may be formed including the components listed in Table 6.

TABLE 6

| Component | Amount |
| --- | --- |
| PVC (BASE RESIN) | 90 wt % |
| Dow Corning ® MB50-008 Masterbatch (LOW FRICTION) | 4 wt % |
| McLube MoS2-100 (molybdenum disulfide) | 2 wt % |
| AEROSIL R 8200 (fumed silica) | 2 wt % |
| Zano 20 plus (zinc oxide) | 2 wt % |
| Total | 100 wt % |

The components may be mixed within an extruder, or prior to extrusion (e.g., as pellets/powders, as melted components, and/or the like). The components are extruded at a temperature of between about 165-175° C. onto an outer surface of a conductor. The resulting coated conductor requires a significantly reduced amount of force to pull the conductor though a building passageway than a similar conductor (e.g., having the same gauge) without the inclusion of the various additives. Moreover, the resulting cable has an improved resistance to UV-based degradation, abrasion and moisture intrusion.

Example 7

A coating composition that may be extruded around an outer surface of a conductor to form a medium-voltage cable may be formed including the components listed in Table 7.

TABLE 7

| Component | Amount |
| --- | --- |
| CPE (BASE RESIN) | 87 wt % |
| Dow Corning ® MB25-501 Masterbatch | 4 wt % |

TABLE 7-continued

| Component | Amount |
|---|---|
| (LOW FRICTION) | |
| McLube MoS2-100 (molybdenum disulfide) | 3 wt % |
| AEROSIL R 805 (fumed silica) | 4 wt % |
| Zano 20 plus (zinc oxide) | 2 wt % |
| Total | 100 wt % |

The components may be mixed within an extruder, or prior to extrusion (e.g., as pellets/powders, as melted components, and/or the like). The components are extruded at a temperature of between about 150-200° C. onto an outer surface of a conductor. The resulting coated conductor requires a significantly reduced amount of force to pull the conductor though a building passageway than a similar conductor (e.g., having the same gauge) without the inclusion of the various additives. Moreover, the resulting cable has an improved resistance to UV-based degradation, abrasion and moisture intrusion.

CONCLUSION

Many modifications and other embodiments will come to mind to one skilled in the art to which this disclosure pertains having the benefit of the teachings presented in the foregoing descriptions. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An electrical cable comprising:
   at least one conductor capable of carrying an electrical current through the electrical cable; and
   a sheath for protecting the conductor, wherein the sheath comprises:
      a polymeric composition electrically insulating the conductor, wherein the polymeric composition comprises:
         a Linear Low Density Polyethylene (LLDPE) base polymer; and
         an abrasion reducing agent comprising molybdenum disulfide provided in an amount of between about 0.1% to about 5% by weight of the polymeric composition.

2. The electrical cable of claim 1, wherein the polymeric composition comprises at least one of: a hydrophobic silica; an ultraviolet protecting agent; or a lubricant.

3. The electrical cable of claim 2, wherein the polymeric composition comprises a lubricant, and wherein the lubricant comprises erucamide.

4. The electrical cable of claim 2, wherein the polymeric composition comprises a lubricant, and wherein the lubricant comprises silicone oil.

5. The electrical cable of claim 1, wherein the sheath comprises a first layer and a second layer, and wherein the first layer defines an outer surface of the electrical cable, and wherein the first layer comprises the polymeric composition.

6. The electrical cable of claim 5, wherein the polymeric composition is a first polymeric composition, and wherein the second sheath layer comprises a second polymer composition different from the first polymer composition.

7. The electrical cable of claim 1, wherein the polymeric composition comprises:
   between about 0.1% to about 8% of an ultraviolet protecting agent;
   between about 1% to about 15% of a lubricant; and
   between about 1% to about 8% of a hydrophobic agent.

8. The electrical cable of claim 7, wherein:
   the ultraviolet protecting agent is selected from: zinc oxide, titanium dioxide, or carbon black;
   the lubricant is selected from: silicone oil or erucamide; and
   the hydrophobic agent is a hydrophobic silica.

9. An electrical cable comprising:
   at least one conductor capable of carrying an electrical current through the electrical cable; and
   a sheath for protecting the conductor, wherein the sheath comprises:
      a polymeric composition electrically insulating the conductor, wherein the polymeric composition comprises:
         a Linear Low Density Polyethylene (LLDPE) base polymer;
         an abrasion reducing agent comprising molybdenum disulfide provided in an amount of between about 0.1% to about 5% by weight of the polymeric composition; and
         a hydrophobic agent comprising a hydrophobic silica provided in an amount of between about 1% to about 8% by weight of the polymeric composition.

10. The electrical cable of claim 9, wherein the hydrophobic silica is one of a fumed silica or a pyrogenic silica.

11. The electrical cable of claim 9, wherein the polymeric composition comprises at least one of: an ultraviolet protecting agent or a lubricant.

12. The electrical cable of claim 11, wherein the polymeric composition comprises a lubricant, and wherein the lubricant comprises silicone oil.

13. The electrical cable of claim 11, wherein the polymeric composition comprises a lubricant, and wherein the lubricant comprises erucamide.

14. The electrical cable of claim 9, wherein the sheath comprises a first layer and a second layer, and wherein the first layer defines an outer surface of the electrical cable, and wherein the first layer comprises the polymeric composition.

15. The electrical cable of claim 14, wherein the polymeric composition is a first polymeric composition, and wherein the second sheath layer comprises a second polymer composition different from the first polymer composition.

16. An electrical cable comprising:
   at least one conductor capable of carrying an electrical current through the electrical cable; and
   a sheath for protecting the conductor, wherein the sheath comprises:
      a polymeric composition electrically insulating the conductor, wherein the polymeric composition comprises:
         a Linear Low Density Polyethylene (LLDPE) base polymer;
         an abrasion reducing agent comprising molybdenum disulfide provided in an amount of between about 0.1% to about 5% by weight of the polymeric composition; and
         a lubricant.

17. The electrical cable of claim 16, wherein the lubricant is provided in an amount of between about 1% to about 15% by weight of the polymeric composition.

18. The electrical cable of claim 16, wherein the polymeric composition comprises at least one of: a hydrophobic agent or an ultraviolet protecting agent.

19. The electrical cable of claim 16, wherein the lubricant comprises silicone oil.

20. The electrical cable of claim 16, wherein the lubricant comprises erucamide.

21. The electrical cable of claim 16, wherein the sheath comprises a first layer and a second layer, and wherein the first layer defines an outer surface of the electrical cable, and wherein the first layer comprises the polymeric composition.

22. The electrical cable of claim 21, wherein the polymeric composition is a first polymeric composition, and wherein the second sheath layer comprises a second polymer composition different from the first polymer composition.

* * * * *